United States Patent [19]

Lorentz et al.

[11] Patent Number: 5,637,199
[45] Date of Patent: Jun. 10, 1997

[54] SPUTTERING SHIELDS AND METHOD OF MANUFACTURE

[75] Inventors: Robert D. Lorentz, North Oaks; Joseph H. Sexton, Oakdale, both of Minn.

[73] Assignee: Minnesota Mining and Manufacturing Company, St. Paul, Minn.

[21] Appl. No.: 904,835

[22] Filed: Jun. 26, 1992

[51] Int. Cl.$^6$ ................................................. C23C 14/34
[52] U.S. Cl. ................................ 204/192.1; 204/298.11; 264/86; 427/372.2
[58] Field of Search ........................ 204/192.1, 192.12, 204/298.01, 298.02, 298.04, 298.11; 264/86; 427/372.2

[56] References Cited

U.S. PATENT DOCUMENTS

| | | | |
|---|---|---|---|
| 3,879,278 | 4/1975 | Grosewald et al. | 204/192 |
| 4,049,523 | 9/1977 | Boehnke et al. | 204/192 R |
| 4,416,755 | 11/1983 | Ceasar et al. | 204/192 S |
| 5,091,221 | 2/1992 | Chu et al. | 427/242 |
| 5,135,629 | 8/1992 | Sawada et al. | 204/192.1 X |
| 5,160,675 | 11/1992 | Iwamoto et al. | 264/56 |

FOREIGN PATENT DOCUMENTS

| | | | |
|---|---|---|---|
| 0288010 | 10/1988 | European Pat. Off. | B22F 3/14 |
| 53-99082 | 8/1978 | Japan . | |
| 63-83257 | 4/1988 | Japan . | |
| 63-262208 | 10/1988 | Japan | B28B 1/26 |
| 2-267262 | 11/1990 | Japan . | |

OTHER PUBLICATIONS

"A New High-$T_c$ Oxide Superconductor without a Rare Earth Element", Hiroshi Maeda, Yoshiaki Tanaka, Masao Fukutomi and Toshihisa Asano, *Japanese Journal of Applied Physics*, vol. 27, No. 2, Feb., 1988, pp. L209–L210.

"Superconductivity in the High-$T_c$ Bi–Ca–Sr–Cu–O System: Phase Identification", R.M. Hazen, et al., *Physical Review Letters*, vol. 60, No. 12, Mar. 21, 1988, pp. 1174–1177.

"Two–Dimensional Superstructure in the (001) Plane of $Bi_2[Ca,Sr]_3Cu_2O_{8+\delta}$ Thin Films", A.F. Marshall et al., *American Institute of Physics*, Appl. Phys. Lett. 53(5), Aug., 1, 1988, pp. 426–428.

"Superconductivity in Thin Films of the Bi–Ca–Sr–Cu–O System", J.H. Kang, R.T. Kampwirth, K.E. Gray, S. March and E.A. Huff, *Physics Letters A*, vol. 128, No. 1.2, Mar. 21, 1988, pp. 102–104.

"Superconducting Oxide Thin Films by Ion Beam Sputtering", P.H. Kobrin, J.F. DeNatale, R.M. Housley, J.F. Flintoff and A.B. Harker, *Advanced Ceramic Materials* vol. 2, No. 3B, Special Issue, 1987, pp. 430–435.

"Oriented High–Temperature Superconducting Bi–Sr–Ca–Cu–O Thin Films Prepared by Ion Beam Deposition", Robert D. Lorentz and J.H. Sexton, *American Institute of Physics*, Appl. Phys. Lett. 53, Oct. 24, 1988, pp. 1654–1656.

"Reactive Ion Beam Deposition of Thin Films in the Bismuth–Calcium–Strontium–Copper Oxide Ceramin Superconductor System", A.B. Harker, P.H. Kobrin, P.E.D. Morgan, J.F. DeNatale, J.J. Ratto, I.S. Gergis and D.G. Howitt, *American Institute of Physics*, Appl. Phys. Lett. 52(25), Jun. 20, 1988, pp. 2186–2187.

"Sputter Deposition of Y–Ba–Cu–O Superconducting Thin Films from an Oxide Powder Target", J. Argana, R.C. Rath, A.M. Kadin and P.H. Ballentine, American Vacuum Society Topical Conference on High Temperature Superconductors, Anaheim, CA, Nov. 6, 1987.

*Primary Examiner*—Nam Nguyen
*Attorney, Agent, or Firm*—Gary L. Griswold; Walter N. Kirn; H. Sanders Gwin, Jr.

[57] ABSTRACT

Coated shields useful in a sputtering deposition chamber comprise a binder and particles of the same material as the target. Application of the coating material to interior surfaces and appliances of the sputtering chamber reduces contamination of the sputtered material.

7 Claims, 3 Drawing Sheets

SPUTTERING SHIELDS AND METHOD OF MANUFACTURE

BACKGROUND OF THE INVENTION

Sputtering is one of several well known techniques for applying or depositing a layer on a substrate. Generally, the substrate is placed in a deposition chamber which is evacuated or pressurized to a desired pressure. A particle flux of the coating material is generated within the chamber and the coating or deposition occurs by condensation of the particle flux onto the substrate surface.

In the ion beam bombardment sputtering technique, a high-energy source beam of ions is directed toward the target. The force of the bombarding ions imparts sufficient energy to the atoms of the target to cause the energized atoms to leave the target and form a particle flux. The resulting deposition upon a substrate forms a thin film.

Sputtering targets may be, for example, solid metallic blocks of a selected element or alloy. For sputtering of ceramic materials, targets may be dry powders made into a unitary porous structure. Other dry powder targets may be prepared by mixing the materials to be deposited into a binder-solvent slurry, casting the slurry into a mold, and applying heat to drive off the solvent and cure the binder. Such targets are prone to impurities (from the binder), frequent cracking from thermally-induced stresses, blistering (from embedded gasses), and difficulty in repairing targets damaged during the sputtering operation.

The use of a shield surrounding a target, and which is of the same material as the target, is described in Kokai Publication No. JP 63-83257. In that publication, the entire target shield is of the same material as the target. In one example, where the target material is made of silicon dioxide (SiO2), the entire shield is also made of bulk silicon dioxide, which is neither flexible nor malleable. In another example, where the target material is aluminum, the entire shield is made of aluminum sheet or plate. In another Japanese publication, Kokai Publication No. JP 53-99082, a high-frequency sputtering device is disclosed which is constructed with a shield plate arranged on a support between the base and the target. The surface of the base support and shield plate facing the target are coated with the same material as the target. The publication actually describes such coatings as plates or disks which are held in position by brazing. This implies relatively large masses comprised of the target material. The utility of that invention would be restricted to targets which are solid metals or alloys in that the same material as disclosed is evidently a rigid mass and must also be a suitable candidate for brazing.

U.S. Pat. No. 4,416,755, discloses and claims a sputtering apparatus comprising shield means having a low sputtering efficiency compared to a sputtering target. The shield means are disposed in a vacuum chamber between stray ion beams and the vacuum chamber surface and any implements contained in the chamber so that sputtering of the vacuum chamber surface and/or the implements by a plasma is minimized. Dependent claims in the patent describe the shield as flexible and made of carbon. The patent does admit to some sputtering of the carbon as possible, although at a much reduced level compared to unwanted sputtering of the stainless steel vacuum chamber surfaces.

SUMMARY OF THE INVENTION

The invention comprises a method of manufacturing shielding for use in a sputtering deposition system to reduce impurities deposited in a coating on a substrate. The method includes providing shielding material, and combining a volatile suspending liquid and a binder with the shielding material to form a slurry. The slurry is suitable for placing onto an internal surface of a sputtering deposition system.

The invention comprises a method of manufacturing shielding for use in a sputtering deposition system to reduce impurities deposited in a coating on a substrate. A method comprises providing a quantity of shielding material, and combining a volatile suspending liquid and a binder with the shielding material to form a slurry. The slurry is suitable for placing onto portions of a target mold to be placed within the sputtering deposition system.

The invention comprises a method of manufacturing shielding for use in a sputtering deposition system to reduce impurities deposited in a coating on a substrate. The method includes providing a quantity of shielding material, and combining a volatile suspending liquid and a binder with the shielding material to form a slurry suitable for placement on another surface. The slurry is then placed on a shielding structure surface which is removable from the sputtering deposition system.

DETAILED DESCRIPTION OF THE INVENTION

Ion beam deposition methods are used to produce various superconducting films. Typically, a focused beam of ions is directed toward a single target of the material to be sputtered. Problems arise in this type of process, however, since the incident ion beam typically has a Gaussian profile and ions in the tail of this distribution may sputter material from the vacuum chamber walls or from around the target holder. This leads to contamination of the deposited film. A primary impurity is often Fe, with smaller amounts of Cr and Ni also present in various instances. This indicates that the contamination source in each observation is stainless steel from the chamber walls and from the target table itself. Two routes of contamination are most likely. The impurities are either directly deposited onto the substrates or are deposited onto the target itself, from where the growing film is contaminated. Therefore, new processes are still necessary.

U.S. Ser. No. 07/904,997, now U.S. Pat. No. 5,306,405 discloses a novel sputtering target and method of manufacture. The invention described below adopts and further applies the technology identified in the co-pending application in a novel and non-obvious manner, for example, by use of ambient temperature manufactured target slurry material inside a sputter deposition apparatus.

The invention includes manufacture of slurry-based shields for use, preferably, in ion beam deposition systems. The shields greatly reduce the contamination in the resulting films. Slurry-based targets and shields are successful in producing high temperature superconductive films comprising, for example, atoms/molecules of Y—Ba—Cu—O or Bi—Sr—Ca—Cu—O, although the limitation of the examples to these materials is not intended to limit the application of this invention to only those classes of materials. Additionally, this invention applies to the physical vapor depositions of virtually any materials which can be provided in a powder form and for which a high-purity deposition on a substrate is desirable.

Figure 1:
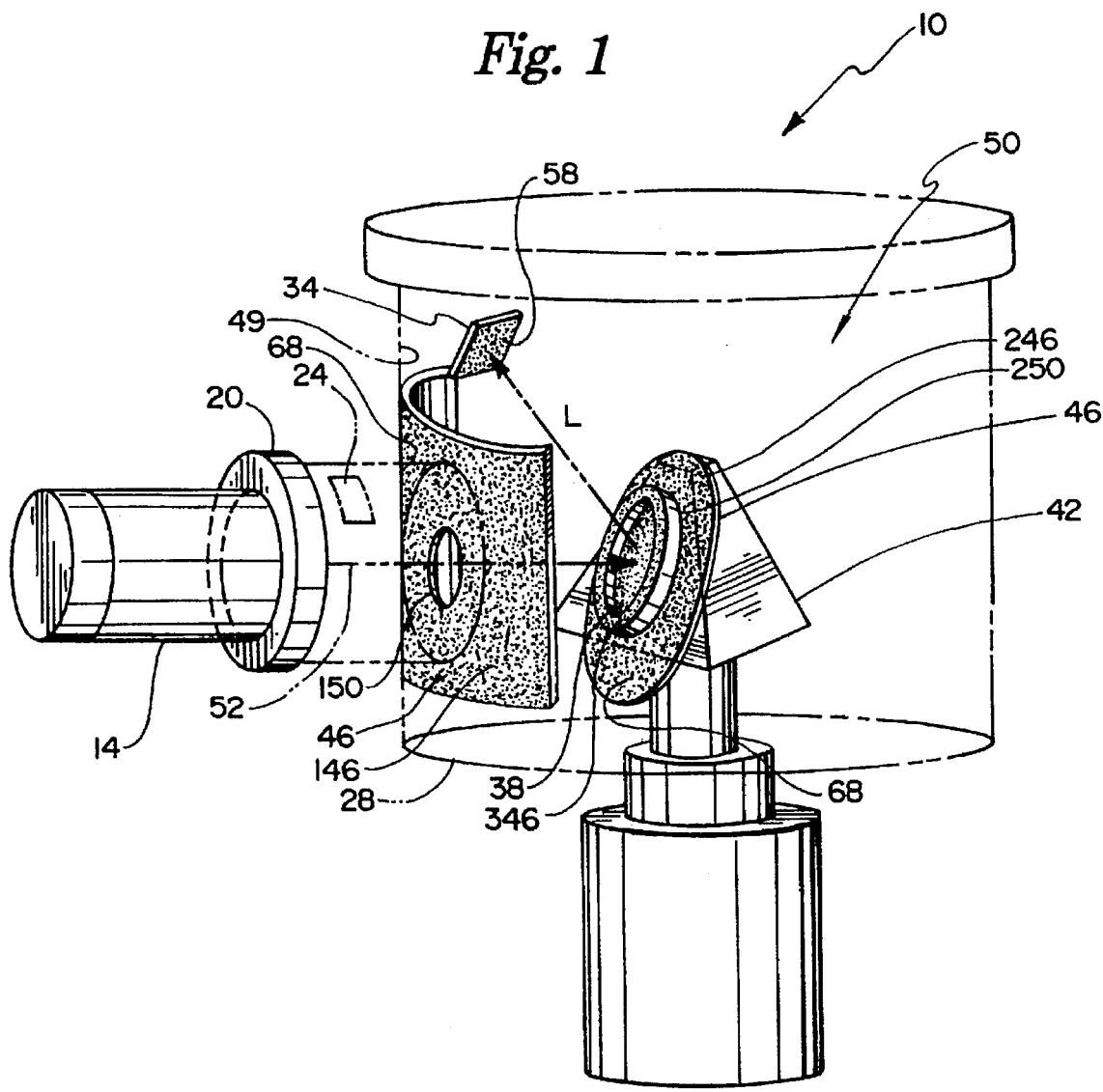
FIG. 1 is a representative schematic of a sputtering apparatus illustrating the positioning of coated shields and the use of such coatings in the apparatus.

Referring to FIG. 1, a representative ion beam deposition apparatus 10 preferably comprises ion gun 14, grids 20, hollow cathode neutralizer 24, chamber assembly 28, removable and replaceable substrate 34, deposition target 38, and target support means such as table 42. Table 42 may comprise a water cooled table. Shielding 46 may also be used. Ion beam deposition apparatus 10 permits an ion beam 52 to be directed from a source toward target 38. The impact of ion beam 52 with target 38 results in the formation of a flux which is deposited as a coating 58, preferably in the form of a thin film, on removable and replaceable substrate 34.

Figure 2:
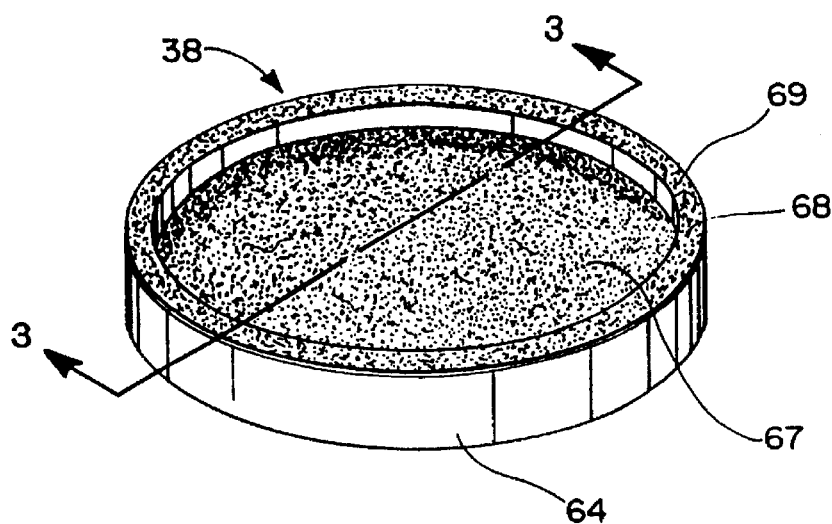
FIG. 2 is a perspective view of a target with this coating applied to selected peripheral portions by a method of this invention.
Figure 3:
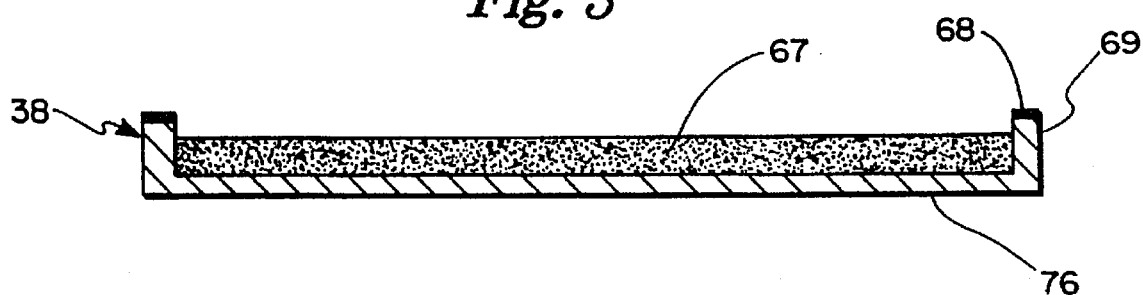
FIG. 3 is a cross-sectional view of a target illustrating the relationship of the target material with the target base and rim.

FIG. 2 and FIG. 3 each illustrate a representative deposition target 38 having a target base 64 also referred to as a mold and target material 67. Base 64 is often in a circular configuration, although it may also be formed in any other generally planar geometrical shape. Base 64 serves as a mold for forming and containing target material 67 during preparation and use. A thin rim 69 around target base 64 helps define the periphery of target material 67, and may also be used to secure target material 67 (or modified target material with a binder, i.e. shielding material 68) to base 64 so that target 38 may be positioned in deposition apparatus 10 without regard to angular orientation. Base plate 76 and thin rim 69 may, but need not have to, be fabricated from a single piece of material. Copper is a well known target base and rim material. Target 38 may be of various geometries and sizes, and other materials may be appropriate, depending on the specifications and requirements of the deposition apparatus and materials.

Referring again to FIG. 1, shielding means 46 is representatively disclosed in various embodiments as a rectangular shield 146, a circular or oblong shield 246, and a rim shield 346. Rectangular shield 146 is, in this embodiment, a 300 mm by 400 mm size and approximately 2 mm thick. It is placed against the inside wall 49 of the vacuum chamber 50 within apparatus 10, generally conforming to the cylindrical interior wall 49, and is preferably electrically grounded to the structure of apparatus 10. A circular aperture 150 with a diameter of approximately 75 mm is located in shield 146 and is placed in line between the ion gun 14 source of ions and target 38. Aperture 150 provides means to shape and restrict the cross-sectional area of the ion beam so that most of the ion beam passing through the aperture will strike target 38. Shielding means 46 preferably comprises a coating of a shielding material 68 onto a shielding structure. For example, shield 146 is coated, at least on the side of the shield facing the ion source, with particles of the same composition as target 38, along with a suitable binder. Subject to impurity levels observed and tolerances required, it may be advisable to coat all external surfaces of shielding means 46 with shielding material 68. Shielding material composition is further described in detail later.

Circular or oblong shield 246, also having an aperture 250 approximately the size and shape of target mold 38, is positioned on target support table 42 so that aperture 250 permits exposure of the target material to the ion beam while also protecting target-supporting structures from impingement by ion beam particles. Shield 246 is preferably electrically grounded to the structure of apparatus 10. Shield 246 is selectively coated with shielding material 68 so that at least the side of the shield facing the ion source is coated. The coating comprises particles of the same composition as the target, along with a suitable binder. It is also preferably of the same composition as the shielding material used to coat shield 146. Additional shielding material 68 may be applied to the interior surfaces and associated implements of chamber 50, such as wall 49 itself, or even as a coating on rim 69 of target 38 shown best in FIG. 2 and FIG. 3. The use of shielding material 68 with readily removable shielding structure is preferred, especially when the target material compositions are to be frequently altered.

Figure 4:
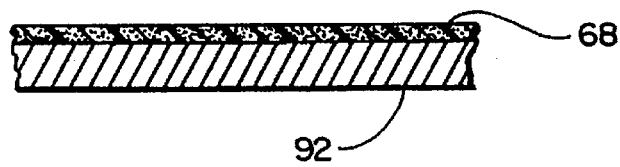
FIG. 4 is a cross-sectional view of shielding material on a substrate such as a shielding structure.

FIG. 4 illustrates a coating of shielding material 68 on a substrate 92. Substrate 92 may be copper or other metallic, heat-conducting shielding structure, or it may comprise the walls and/or associated implements of a sputtering chamber. The protective coating of shielding material 68 is comprised of a distribution of particles in a binding matrix. The chemical composition of particles will vary, depending on the composition of the sputtering target material. For example, if the sputtering target material is MgO, then the particles in the coating should also be MgO. If the target material is $ZnO_2$, then the particles in the coating should be $ZnO_2$. The binding matrix may be selected from virtually any of the class of polymers or adhesives which cure or set by evaporation of a solvent, but which effectively bind to the structures discussed above.

The Fe contamination problem often found in ion beam deposited thin films is significantly reduced by using slurry-paint coated shielding means inside a vacuum chamber. Shielding means eliminates various modes of contamination of the growing thin film, such as stray ions striking the chamber walls or the target table and impinging onto the film, or coating of the target itself with material from the chamber walls, eventually causing contamination of the film as well. The use of plain copper shields is not as effective since copper sputtered from shields contributes to the copper content of the film. The use of slurry paint of similar composition to the target, however, allows shielding to be used without causing contamination of the growing film with undesired shielding material.

Shielding means 46 is durable, with no delamination occurring when the structure experiences moderate flexure, as is often necessary during installation of assorted shields into a vacuum chamber. For example, a ⅜ inch (0.95 centimeters) diameter post is covered with a slurry-paint coated copper foil. This foil is painted while flat, but is loosely wrapped around the post inside a vacuum chamber after drying. This is accomplished without flaking of the shielding material. During installation, the shields are occasionally scraped against sharp protrusions inside the chamber, but the coating is durable and resistant to such scratches. Also, touch-up repairs using the coatings(s) are readily performed on any scratches which do occur.

Standard laboratory practice teaches against the use of an organic material, such as an organic binder, in a vacuum system. In contrast to that teaching, the invention discloses that the relatively low vapor pressure materials suggested as preferred binder materials are indeed vacuum compatible. Accordingly, use of a shielding material within a deposition system vacuum chamber, in which the shielding material comprises an organic binder and a metallic shield structure, is found to be a fully acceptable manufacturing process with a low power ion beam deposition system for a limited period of time. The pump-down time of a vacuum system with shielding material 68 is not increased and the normal base pressure of the system is achievable with shielding material 68 inside the chamber.

Data from multiple tests of shielding material 68 indicates that use of slurry-paint coated shielding means reduces the resulting Fe impurity levels in the deposited films 58 by up to 15 times in some tests, with a common range of reduction of between 5–15 times. Prior to use of this novel shielding means, films had Fe impurity levels typically between 0.2 and 0.6 weight percent. With the use of slurry-painted shielding means 46, impurity levels were routinely below 0.04 weight percent Fe. Film compositions and impurities are measured with inductively coupled plasma emission spectroscopy.

Figure 5:
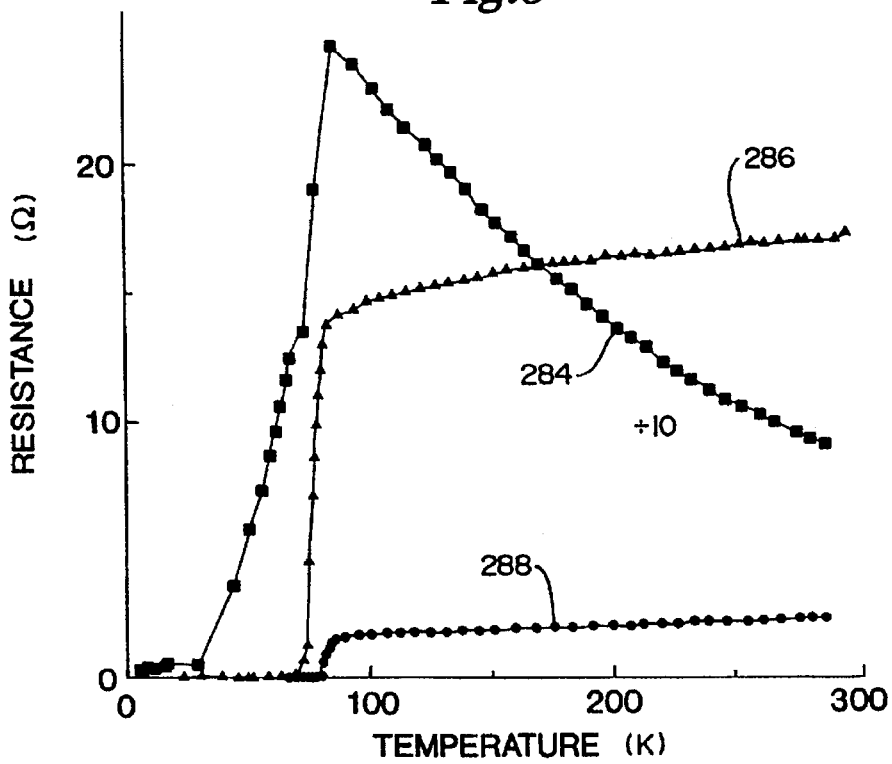
FIG. 5 is a graph depicting the resistance versus temperature behavior of three films with various impurity levels.

FIG. 5 shows the resistance versus temperature behavior of three films with various impurity levels. All films are prepared under similar conditions, are deposited onto single crystal MgO substrates, and are annealed for 2 hours at 900° C. in flowing oxygen. These three films had nearly identical compositions of $Y_{0.87}Ba_{2.00}Cu_{3.18}$, $Y_{0.87}Ba_{2.00}Cu_{3.16}$, and $Y_{0.87}Ba_{2.00}Cu_{3.13}$. The slight differences in composition were not likely responsible for the large difference in transition properties observed. Instead, it appears that the electrical behavior of these films was strongly dependent on their Fe contamination level. Standard four point probe electrical measurements with pressed indium contacts were used to measure the transition temperatures. Currents of 9 microamps were applied to the films. The voltage-lead separations and film thicknesses were similar in all three films. The resistance for film 284, which was produced with 0.25 weight percent Fe increased as the temperature was reduced from room temperature. At about 77 K, a sharp drop in the resistance occurred, but the film never became completely superconducting, even down to 5 K. The normal state resistance of this film is significantly higher than that of the other two. In the graph of FIG. 5, the resistance of this film has been divided by 10. Film 286, produced with 0.13 weight percent Fe, showed metallic behavior above a superconducting transition onset temperature of about 81 K and reached zero resistance at 68 K. Film 288, with the lowest Fe content of 0.033 weight percent, had a much lower resistance in the normal state. For film 288, the superconducting transition had its sharp onset at about 89 K, with $T_c(R=0)$ reached at 79.5 K. Accordingly, great advantage in material properties of the resulting film is realized by reduction in Fe contamination through use of the novel shielding means disclosed above.

Slurry-prepared shielding may be useful in other sputtering applications as well. For example, pre-sputtering from a magnetron target may cause re-sputtering from a shutter in place above the magnetron. If the shutter is stainless steel, some Fe could be directed back to the target and be deposited onto the film after pre-sputtering was completed. If the bottom of such a shutter was coated with slurry paint of the same composition as the target, such contamination could be avoided. Particular slurry-prepared shielding is discussed in the following six examples, although other examples exist.

Example 1

A powder target of composition $Y_{0.91}Ba_{2.13}Cu_{3.04}O_x$ is placed on water-cooled target support table 42 in ion-beam deposition apparatus 10 schematically illustrated in FIG. 1. Pressure inside apparatus 10 is reduced to a system base pressure of about $1\times10^{-7}$ torr ($1.3\times10^{-3}$ kPa), reaching this value after approximately 8 hours of pumping. High-purity Argon gas is then admitted, under control of a gas flow regulator (not shown) to the interior of the apparatus until the desired deposition pressure of $1.4\times10^{-4}$ torr ($1.82\times10^{-5}$ kPa) is reached, with this pressure being maintained throughout the ensuing deposition process. Shields 146 and 246, positioned in deposition apparatus 10 as described earlier, were coated with the following composition:

Binder: Devcon DUCO™ Cement, produced by Devcon Corp., Wedlock, Ill. 60191, 5 weight percent
Solvent: Acetone, 22 weight percent
Particulate: $Y_{0.91}Ba_{2.13}Cu_{3.04}O_x$ in powder form, 73 weight percent Additional quantities of acetone were added to the mixture during the application process to replace acetone which evaporated, and the amount of solvent required was determined by what was required to maintain flow properties of the mixture. Application of this protective composition may be by any convenient means, including brush, roller, dipping, spraying and other techniques. The solvent was allowed to evaporate for eight hours before the shields were installed in the deposition apparatus. The ratio of binder-to-particulate (approx. 1:15.6 by weight) may vary considerably over that specified, and will generally vary when powders of different composition are used.

A glass substrate 34 was positioned about 150 mm from target 38, approximately in line L with the central path of target material being sputtered from target 38. The ion-beam comprised Argon ions with 1000 eV energy and beam current of about 200 milliamperes. A deposition rate of approximately 0.9 angstroms/second (0.09 nanometers/second) was achieved under these conditions, and the deposited film thickness was about 1 micron ($1\times10^{-3}$ millimeters). Compositional analysis of the deposited film was performed using inductively coupled plasma emission spectroscopy and gave the following result: $Y_{0.87}Ba_{2.00}Cu_{3.18}O_x$, which values correspond quite closely to the composition of the target material used in this example. The increase in copper concentration in the deposited film over that found in the target results from a characteristic of the sputtering process. The amount of copper in the target is predetermined in order to achieve the desired amount of copper in the deposited film. Because of the protective coating applied to shields 146 and 246, it is believed that copper in the resultant film came from the target material and not from the shields. Analysis of the resultant film indicated the presence of 0.022 weight percent of Fe impurities, which is believed to have originated from ions striking unprotected areas of the deposition chamber. Previous depositions made from the same target material of this example, and without using shielding means 46, contained approximately 0.1–0.5 weight percent of Fe.

Example 2

Figure 6:
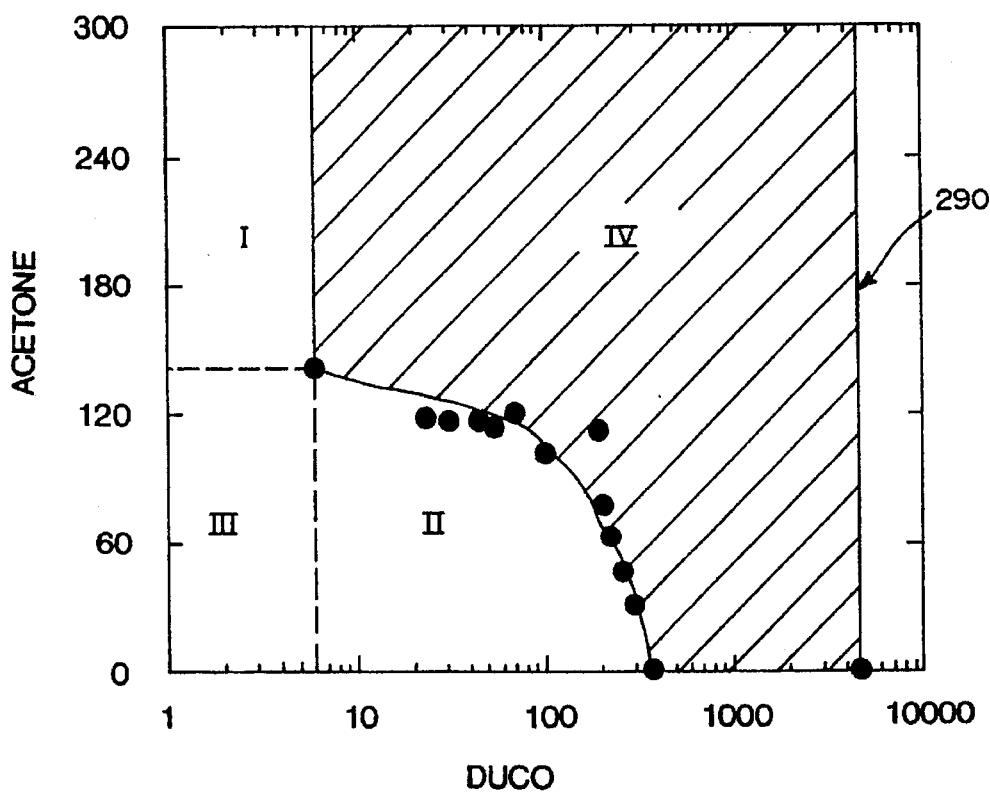
FIG. 6 is a graph demonstrating the acceptable range of ratios of binder-to-solvent for a specific set of binder and solvent.

This example describes coatings having shielding material of the same material constituents as in Example 1, in which the ratio of solvent-to-binder was varied to determine acceptable proportions of these components which could affect their utility in terms of coatability, adhesion, and survivability upon direct impact from ion beam radiation. A plurality of 1 mm thick copper sheets were coated with a composition comprised of DUCO™ cement as the binder, acetone as the solvent, and a particulate comprised of $Y_1Ba_2Cu_3O_x$ in powder form. For each sheet, the ratio by weight of binder-to-added solvent was varied from no solvent added to a ratio of about 1:23. The graph shown in FIG. 6 illustrates the results of this example. The numerical units of both abscissa and ordinate of the graph are weight functions, normalized to a particulate weight of 1000 grams. Ratios falling in zone I lacked adequate adhesion to the substrate. Ratios falling in zone II were too thick for good spreading, and ratios falling in zone III would not adhere or easily spread. Ratios falling in the shaded area zone IV of FIG. 3 were deemed acceptable. Line 290 of FIG. 6 represents a practical limit of the binder weight for the 1000 grams of particulate in that many applications of the composition would be required to ensure an adequate amount of the particulate for the purposes of the invention. Actual depositions onto substrate 34 were not made for this example.

Example 3

This example is similar to Example 2 except that the coating composition was comprised of the following:

Binder: Scotch® Brand Super Strength Adhesive Manufactured by Household Products Division, 3M Company, St. Paul, Minn., catalog number 6004, 3M part No. 34-7012-6738-6.
Solvent: Acetone
Particulate: $Y_1Ba_2Cu_3O_x$ In this experiment, 3.37 grams of acetone were added to 2.17 grams of the binder, and 9.28 grams of the particulate were added to the mixture. The ratio of binder-to solvent was about 1:1.55. No damage was observed following the exposure to ion beam flux.

Example 4

This example is similar to Example 2 except that the coating composition was comprised of the following:

Binder: Scotch-Grip® Brand Rubber and Gasket Adhesive 3M Company, St. Paul, Minn., catalog number 847, 3M part No. 62-0847-2631-4.
Solvent: Acetone
Particulate: $Y_1Ba_2Cu_3O_x$ In this experiment, 2.70 grams of acetone were added to 1.97 grams of the binder, and 10.75 grams of the particulate were added to the mixture. The ratio of binder to solvent, was about 8:11. No damage was observed following the exposure to the ion beam flux.

Example 5

This example is similar to Example 2 except that the coating composition was comprised of the following:

Binder: Devcon DUCO™ Cement (Manufactured by Devcon Corp., Wedlock, Ill. 60191)
Solvent: Butyl Acetate
Particulate: $Y_1Ba_2Cu_3Ox$ In this experiment, 4.39 grams of butyl acetate were added to 2.25 grams of the binder, and 11.11 grams of the particulate were added to the mixture. The ratio of binder-to-solvent was about 1:1.95. No damage was observed following the exposure to ion beam flux.

Example 6

A powder target of composition $Bi_{4.00}Sr_{2.90}Ca_{2.94}Cu_{4.1}O_x$ was positioned on water-cooled target support table 42 in ion-beam deposition apparatus 10, schematically illustrated in FIG. 1. Pressure inside apparatus 10 was reduced to a system base pressure of about $1\times10^{-7}$ torr ($1.3\times10^{-8}$ kPa), reaching this value after approximately 8 hours of pumping. High-purity Argon gas was then admitted, under control of a gas flow regulator (not shown) to the interior of the apparatus until the desired deposition pressure of $1.4\times10^{-4}$ torr ($1.82\times10^{-5}$ kPa) was reached, with this pressure being maintained throughout the ensuing deposition process. Shields 146 and 246, positioned in deposition apparatus 10 as described earlier, were protected with coating of the following composition:

Binder: Devcon DUCO™ Cement, produced by Devcon Corp., Wedlock, Ill. 60191, 5 weight percent
Solvent: Acetone, 33 weight percent
Particulate: $Bi_{4.00}Sr_{2.90}Ca_{2.94}Cu_{4.10}O_x$ in powder form, 62 weight percent Additional quantities of acetone were added to the mixture during the application process to replace acetone which evaporated, and the amount of solvent required was determined by what was required to maintain flow properties of the mixture. Application of this protective composition can be by any convenient means, including by brush, roller, dipping, spraying, and other techniques. The solvent was allowed to evaporate for several hours before the shields were installed in the deposition apparatus.

A glass substrate 36 was positioned about 150 mm from the target 38, approximately in line L with the central path of target material being sputtered from target 38. The ion-beam comprised Argon ions with 1000 eV energy and beam current of about 200 milliamperes. A deposition rate of approximately 0.9 angstroms/second was achieved under these conditions, and the deposited film thickness was about 1 micron ($1\times10^{-3}$ millimeters). Compositional analysis of the deposited film was performed using inductively coupled plasma emission spectroscopy and gave the result of $Bi_{4.00}Sr_{3.12}Ca_{3.03}Cu_{4.56}O_x$, which values correspond quite closely to the composition of the target material used in this example. No Fe impurities were detectable. The increase in copper concentration in the deposited film over that found in the target results from a characteristic of the sputtering process. The amount of copper in the target is predetermined in order to achieve the desired amount of copper in the deposited film. Because of the protective coating applied to shields 146 and 246, it is believed that copper in the resultant film came from the target material and not from the shields.

We claim:

1. A method of forming a shield in a sputter deposition apparatus, comprising the steps of:
   providing a shielding material;
   combining a volatile suspending liquid and a binder with the shielding material to form a slurry;
   applying the slurry to a shielding surface in a sputter deposition apparatus; and
   drying the slurry by evaporating the volatile suspending liquid at a temperature at least as low as the temperature at which the combining step was performed, thereby forming a shield for reducing impurities deposited in a coating on a substrate during a sputter deposition process.

2. The method of claim 1, wherein the step of drying the slurry is performed at ambient temperature.

3. The method of claim 1, wherein the shielding material is identical to a target material which is to be used in the sputter deposition apparatus.

4. The method of claim 1, wherein the step of applying the slurry to a shielding surface further comprises applying the slurry to a non-rigid, deformable shielding surface.

5. A method of forming a shield on portions of a target-supporting structure in a sputter deposition apparatus, comprising the steps of:
   providing a shielding material;
   combining a volatile suspending liquid and a binder with the shielding material to form a slurry;
   applying the slurry to a portion of a target-supporting structure in a sputter deposition apparatus; and
   drying the slurry by evaporating the volatile suspending liquid at a temperature at least as low as the temperature at which the combining step was performed, thereby forming a shield on portions of the target-supporting structure for reducing impurities deposited in a coating on a substrate during a sputter deposition process.

6. The method of claim 5, wherein the step of drying the slurry is performed at ambient temperature.

7. The method of claim 5, wherein the shielding material is identical to a target material which is to be used in the sputter deposition apparatus.

* * * * *